United States Patent
Boris et al.

(10) Patent No.: US 11,404,280 B2
(45) Date of Patent: *Aug. 2, 2022

(54) PLASMA-BASED PROCESS FOR PRODUCTION OF F AND HF FROM BENIGN PRECURSORS AND USE OF THE SAME IN ROOM-TEMPERATURE PLASMA PROCESSING

(71) Applicant: The Government of the United States of America, as represented by the Secretary of the Navy, Arlington, VA (US)

(72) Inventors: David R. Boris, Silver Spring, MD (US); Scott G. Walton, Fairfax, VA (US)

(73) Assignee: The Government of the United States of America, as represented by the Secretary of the Navy, Washington, DC (US)

(*) Notice: Subject to any disclaimer, the term of this patent is extended or adjusted under 35 U.S.C. 154(b) by 106 days.

This patent is subject to a terminal disclaimer.

(21) Appl. No.: 17/079,605

(22) Filed: Oct. 26, 2020

(65) Prior Publication Data

US 2021/0082687 A1    Mar. 18, 2021

Related U.S. Application Data

(63) Continuation of application No. 16/430,459, filed on Jun. 4, 2019, now Pat. No. 10,854,441.

(Continued)

(51) Int. Cl.
*H01L 21/02* (2006.01)
*H01L 21/311* (2006.01)
(Continued)

(52) U.S. Cl.
CPC .......... *H01L 21/31116* (2013.01); *B08B 7/00* (2013.01); *H01J 37/321* (2013.01);
(Continued)

(58) Field of Classification Search
None
See application file for complete search history.

(56) References Cited

U.S. PATENT DOCUMENTS 4,615,764 A    10/1986  Bobbio
6,348,158 B1    2/2002  Samukawa
(Continued)

FOREIGN PATENT DOCUMENTS

WO    2012067653 A1    5/2012

OTHER PUBLICATIONS

Y. Lee et al., "Atomic Layer Etching of Al2O3 Using Sequential, Self-Limiting Thermal Reactions with Sn(acac)2 and Hydrogen Fluoride," ACS Nano, 9, 2, 2061-2070 (2015).

(Continued)

*Primary Examiner* — Mikhail Kornakov
*Assistant Examiner* — Ryan L Coleman
(74) *Attorney, Agent, or Firm* — US Naval Research Laboratory; Joslyn J Barritt

(57) ABSTRACT

Methods and apparatuses for the production of HF in an electron-beam generated plasma. A gas containing fluorine, hydrogen, and an inert gas such as argon, e.g., $Ar/SF_6/H_2O$ or $Ar/SF_6/NH_3$ flows into a plasma treatment chamber to produce a low pressure gas in the chamber. An electron beam directed into the gas forms a plasma from the gas, with energy from the electron beam dissociating the F-containing molecules, which react with H-containing gas to produce HF in the plasma. Although the concentration of the gas phase HF in the plasma is a very small fraction of the total gas in the chamber, due to its highly reactive nature, the low (Continued)

concentration of HF produced by the method of the present invention is enough to modify the surfaces of materials, performing the same function as aqueous HF solutions to remove oxygen from an exposed material.

5 Claims, 9 Drawing Sheets

Related U.S. Application Data

(60) Provisional application No. 62/682,183, filed on Jun. 8, 2018.

(51) Int. Cl.
*H01J 37/32* (2006.01)
*B08B 7/00* (2006.01)
*H01L 21/67* (2006.01)

(52) U.S. Cl.
CPC ...... *H01J 37/3233* (2013.01); *H01J 37/3244* (2013.01); *H01L 21/02049* (2013.01); *H01L 21/67069* (2013.01); *H01J 2237/335* (2013.01)

(56) References Cited

U.S. PATENT DOCUMENTS

| 2009/0275205 | A1 | 11/2009 | Kiehlbauch et al. |
| 2009/0291518 | A1* | 11/2009 | Kim ................... H01L 33/0093 438/33 |
| 2011/0023908 | A1 | 2/2011 | Neuber et al. |
| 2013/0089988 | A1 | 4/2013 | Wang et al. |
| 2015/0093862 | A1 | 4/2015 | Nainani et al. |
| 2016/0260616 | A1 | 9/2016 | Li et al. |

OTHER PUBLICATIONS

S. Verhaverbeke, et al, "The Etching Mechanisms of SiO2 in Hydrofluoric Acid," J. Electrochem. Soc., 141, 10, 2852-2857 (1994).

S. G. Walton et al., "Electron Beam Generated Plasmas for Ultra Low Te Processing," ECS Journal of Solid State Science and Technology, 4 (6) N5033-N5040 (2015).

C. D. Cothran et. al., "Continuous and pulsed electron beam production from an uninterrupted plasma cathode," Surface and Coatings Technology 267, 111-116 (2015).

D. R. Boris et. al., "On the Mechanism of Pulsed Electron Beam Production From an Uninterrupted Plasma Cathode," IEEE Transactions on Plasma Science 44 (5), 761-768 (2016).

Search Report and Written Opinion dated Oct. 7, 2019 in corresponding International Application No. PCT/US2019/035281.

* cited by examiner

PLASMA-BASED PROCESS FOR PRODUCTION OF F AND HF FROM BENIGN PRECURSORS AND USE OF THE SAME IN ROOM-TEMPERATURE PLASMA PROCESSING

CROSS-REFERENCE

This application is a Continuation of and claims the benefit of priority under 35 U.S.C. § 120 based on U.S. patent application Ser. No. 16/430,459 filed on Jun. 4, 2019, which in turn is a Nonprovisional of and claims the benefit of priority under 35 U.S.C. § 119 based on U.S. Provisional Patent Application No. 62/682,183 filed Jun. 8, 2018. The prior applications and all references cited herein are hereby incorporated by reference into the present disclosure in their entirety.

TECHNICAL FIELD

The present invention provides a method and apparatus for formation of gaseous HF from a gas flow containing argon with trace concentrations of sulfur hexafluoride ($SF_6$) and water ($H_2O$), or $SF_6$ and ammonia ($NH_3$) by directing an electron beam through the gas flow.

BACKGROUND

Interfaces in semiconductor device components and other high value electronic components are often deleteriously affected by the presence of the oxide layers between adjacent materials. Since exposure to ambient conditions is often unavoidable, the removal of oxide layers formed on surfaces is an important part of many materials processing sequences. In particular, the removal of native metal oxides from metal surfaces and $SiO_2$ from silicon (Si) surfaces has broad industrial applications.

Fluorine (F) is often used to remove and etch oxide layers from surfaces due to the fact that F is the only element more electronegative than oxygen. A frequent pathway for the introduction of F to surfaces is through the use of aqueous or gas phase hydrofluoric acid (HF). The standard procedure for attempting to remove any surface oxide involves various wet etches, generally concluding with a "dip" in a bath of dilute hydrofluoric acid (HF). However, exposing a clean substrate to the atmosphere for even a short time allows some oxide to regrow, since many materials, such as silicon, are extremely reactive. Accordingly, it would be desirable to develop an in situ procedure for removing native oxides.

In addition, hydrofluoric acid can produce serious health effects by any route of exposure (inhalation, ingestion, or cutaneous contact) due to the fluoride ion's aggressive, destructive penetration of tissues. Most hydrogen fluoride exposures occur by cutaneous contact with the aqueous solution, where the fluoride ion absorption and penetration can lead to both local cellular destruction and systemic toxicity. The dangers associated with HF exposure makes processing methods that generate controlled quantities of HF from benign precursors highly desirable over conventional aqueous or gas phase HF use which involves storage and eventual disposal of a dangerous substance.

In addition to the problems of subsequent exposure to atmosphere after wet etching, the wet etch chemistries used for industrial native oxide removal involve large quantities of toxic chemicals such as aqueous HF of varying concentrations. The prospect of HF generation in the gas phase at low pressure from more benign precursors is thus desirable from an environmental and personnel safety perspective.

Gas phase HF is particularly effective at removing oxygen from surfaces. Some examples of reactions in which HF are used to remove oxidation include

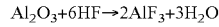

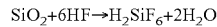

where the HF produces relatively benign aluminum fluoride ($AlF_3$) or hexafluorosilicic acid ($H_2SiF_6$) and water. See Y. Lee et al., "Atomic Layer Etching of $Al_2O_3$ Using Sequential, Self-Limiting Thermal Reactions with $Sn(acac)_2$ and Hydrogen Fluoride," *ACS Nano*, 9, 2, 2061-2070 (2015); and S. Verhaverbeke, et al, "The Etching Mechanisms of $SiO_2$ in Hydrofluoric Acid," *J. Electrochem. Soc.*, 141, 10, 2852-2857 (1994).

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides methods and apparatuses for the production of HF in an electron-beam generated plasma. In accordance with the present invention, a precursor gas containing fluorine, hydrogen, and an inert gas such as argon, e.g., $Ar/SF_6/H_2O$ or $Ar/SF_6/NH_3$ flows into a plasma treatment chamber. An electron beam directed into the gas flow forms a plasma from the gas flow, with energy from the electron beam dissociating the F atoms from the precursor gas components which then produces HF from the hydrogen-containing precursor through hydrogen abstraction. Although the concentration of the gas phase HF in the plasma is very low, comprising only a very small fraction of the total gas and plasma in the chamber, due to its highly reactive nature, the low concentration of HF produced by the method of the present invention is enough to modify the surfaces of materials, performing the same function as aqueous HF solutions to remove oxygen from an exposed material.

In some cases, such as in the case of oxidized aluminum ($Al_2O_3$), the oxygen is replaced with fluorine, creating an aluminum fluoride ($AlF_3$) passivation layer in place of the native oxide layer. The production of thin $AlF_3$ layers on Al surfaces has broad implications, including the preparation of reflective surfaces for far ultra violet (UV) optical applications.

DETAILED DESCRIPTION

Figure 1:
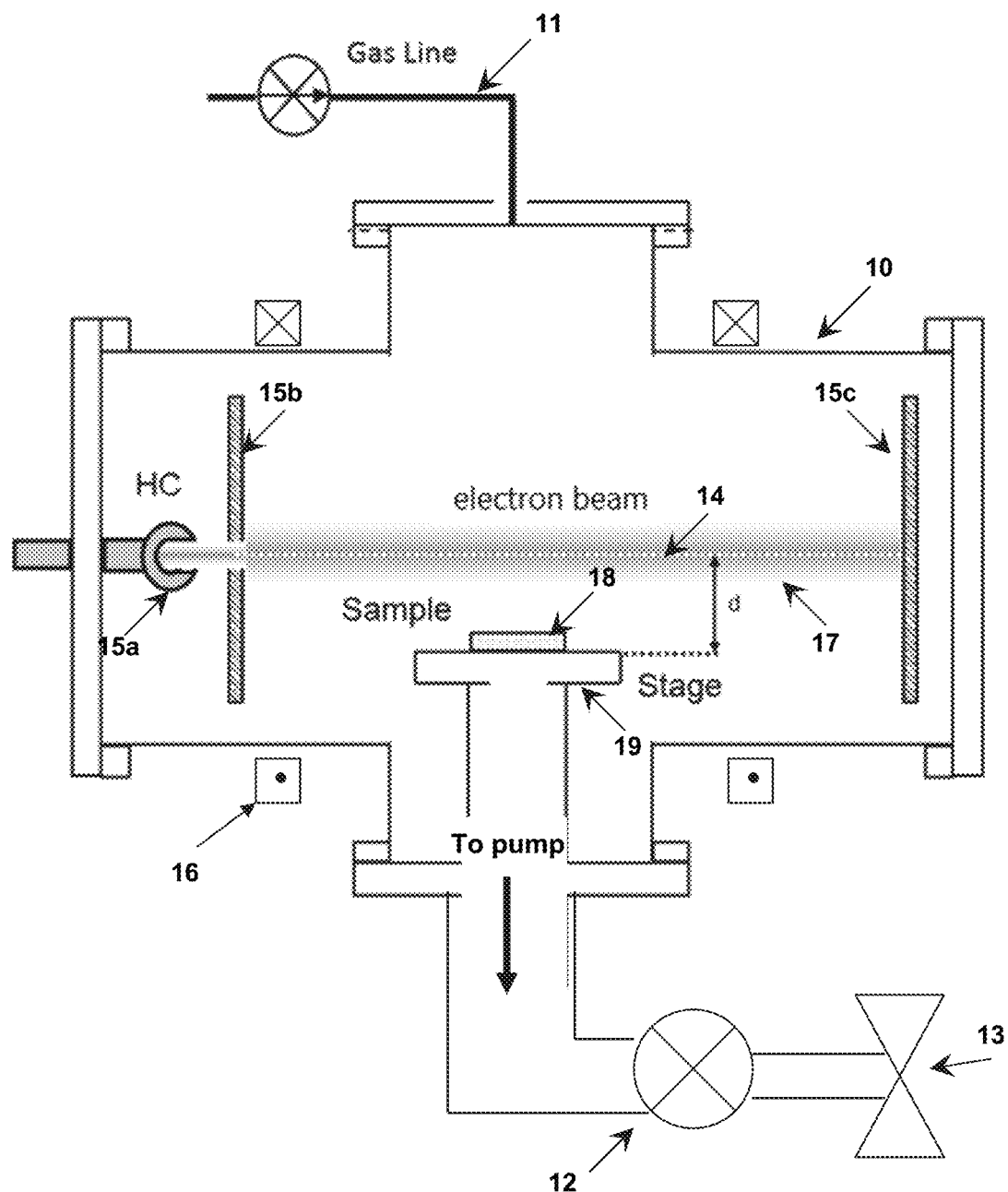
FIG. 1 is a block schematic illustrating aspects of an exemplary apparatus in which an electron beam can be used to generate HF from a gas flow in accordance with the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a process for generating gas phase HF from benign precursors, at low pressures and benign levels from a gas flow containing argon with trace concentrations of sulfur hexafluoride ($SF_6$) and water ($H_2O$), or $SF_6$ and ammonia ($NH_3$) by directing a continuous or pulsed electron beam through the gas flow. As described in more detail below, the method of the present invention employs an electron beam-generated plasma operating in a low-pressure (1 Torr or less) argon background with trace concentrations (typically less than 4%) of H- and F-containing precursors such as sulfur hexafluoride ($SF_6$) and water ($H_2O$), or $SF_6$ and ammonia ($NH_3$). The electron beam dissociates the F from the trace gases and the plasma environment facilitates the formation of HF by hydrogen abstraction from the hydrogen-containing precursor by the highly reactive F atoms. In accordance with the present invention, the total concentration of the H- and F-containing gases in the gas flow, the energy of the electron beam, the current of the electron beam, the duration of the beam application, and/or the frequency of the electron beam pulses (in the case of a pulsed electron beam) can be tailored to provide a predetermined concentration of HF in the plasma. In addition to providing a means of HF generation, the electron beam produces a low temperature plasma which diffuses to the substrate and provides a flux of low energy ions, which can accelerate and enhance chemical reactions at the surface.

The thus-produced HF comprises only a small part of the gas flow due to the low partial pressure of the reactive precursors, but the presence of HF in the plasma incident on the surface of the sample to be treated, combined with additional energetic plasma species, is sufficient for removal of native oxides present on the sample, with the gas phase HF generated within the plasma performing the same function as aqueous HF solutions to remove oxygen from the exposed material, but does not present the risks involved with use of aqueous HF. In some cases, such as in the case of oxidized aluminum (Al), the oxygen is replaced with fluorine, creating an aluminum fluoride ($AlF_3$) passivation layer in place of the $Al_2O_3$. This has broad implications for many applications such as the preparation of reflective surfaces for far ultra violet (UV) optical applications.

As described in more detail below, in accordance with the present invention, an electron beam is passed through the gas flow in a processing chamber containing the oxidized material to be treated.

FIG. 1 illustrates an exemplary apparatus in which an electron beam can be used to generate HF from a gas flow within a chamber, with the HF being used to remove oxidation from a sample situated within the chamber.

In accordance with the present invention, a gas containing fluorine, hydrogen, and an inert gas flows into chamber 10 via gas line 11 and produces a low-pressure gas mixture in the chamber. As described above, the total concentrations of the H- and F-containing gases in the gas flow are low, typically less than 4% of the total flow, with the inert gas making up the remainder of the gas flow. The gas flows through chamber 10 and is output via scrubber 12 coupled to output valve 13. In many embodiments, the gas flow will comprise argon with $H_2O$ and/or $NH_3$ as the H-containing gas and $SF_6$ as the F-containing gas.

The chamber also includes a means to generate an electron beam 14. In the embodiment shown, a hollow cathode-based electron source 15a for electron beam generation, but other electron beam sources can be used. The electron beam passes through an aperture electrode 15b, before stopping at a termination electrode 15c, and magnetic field coils 16 are used for electron beam collimation. Electron beam 14 passes through the gas flow in the chamber, causing the gas to become ionized and producing a plasma 17 extending radially at least a distance d from the electron beam axis.

Oxidized sample 18 to be treated is situated on a stage 19 within the chamber, where the sample is situated in the chamber so that it is immersed in plasma 17 produced by electron beam 14 but is not impacted by the beam itself.

The electron beam used in a method for generating HF from benign precursor gases in accordance with the present invention is generally a high-energy beam having an energy greater than 50 eV, with energies greater than 500 eV being used in many cases. In the case where the electron beam is used to generate HF for material processing, a magnetized electron beam will typically be used. See S. G. Walton et al., "Electron Beam Generated Plasmas for Ultra Low Te Processing," ECS *Journal of Solid State Science and Technol-*

*ogy*, 4 (6) N5033-N5040 (2015). At very low concentrations of the H- and F-containing reactive gases (<4%), HF is formed when the H-containing reactive species in the gas flow, e.g., $H_2O$ or $NH_3$, undergoes hydrogen abstraction due to the presence of atomic F generated within the plasma. In essence, the electron beam generates F atoms via electron impact dissociation of the F-containing precursor molecule, where

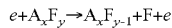

$$e + A_xF_y \rightarrow A_xF_{y-1} + F + e$$

describes an example reaction for an arbitrary precursor $A_xF_y$. Examples of precursors include $SF_6$, $C_2F_6$, $NF_3$ and others. The available atomic F generated by these processes then abstract, or remove, H from the available H-containing precursors such as $H_2O$, or $NH_3$, creating HF in the gas phase.

In the case where the hydrogen source is water vapor in the gas flow, the HF is formed by the reaction

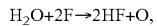

$$H_2O + 2F \rightarrow 2HF + O,$$

while the case where the hydrogen source is ammonia vapor in the gas flow, the HF is formed by the reaction

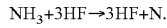

$$NH_3 + 3HF \rightarrow 3HF + N.$$

Thus via the aforementioned electron impact dissociation of the F-containing precursor and hydrogen abstraction reactions where atomic F removes H from the H-containing precursors, a region of HF vapor is produced in the plasma produced by the electron beam. The sample is thereby treated with the HF vapor in the plasma to remove oxidation from its surface, and the HF and the unconverted gas are then output from the chamber by means of the scrubber.

Figures 2A, 2B, 2C:
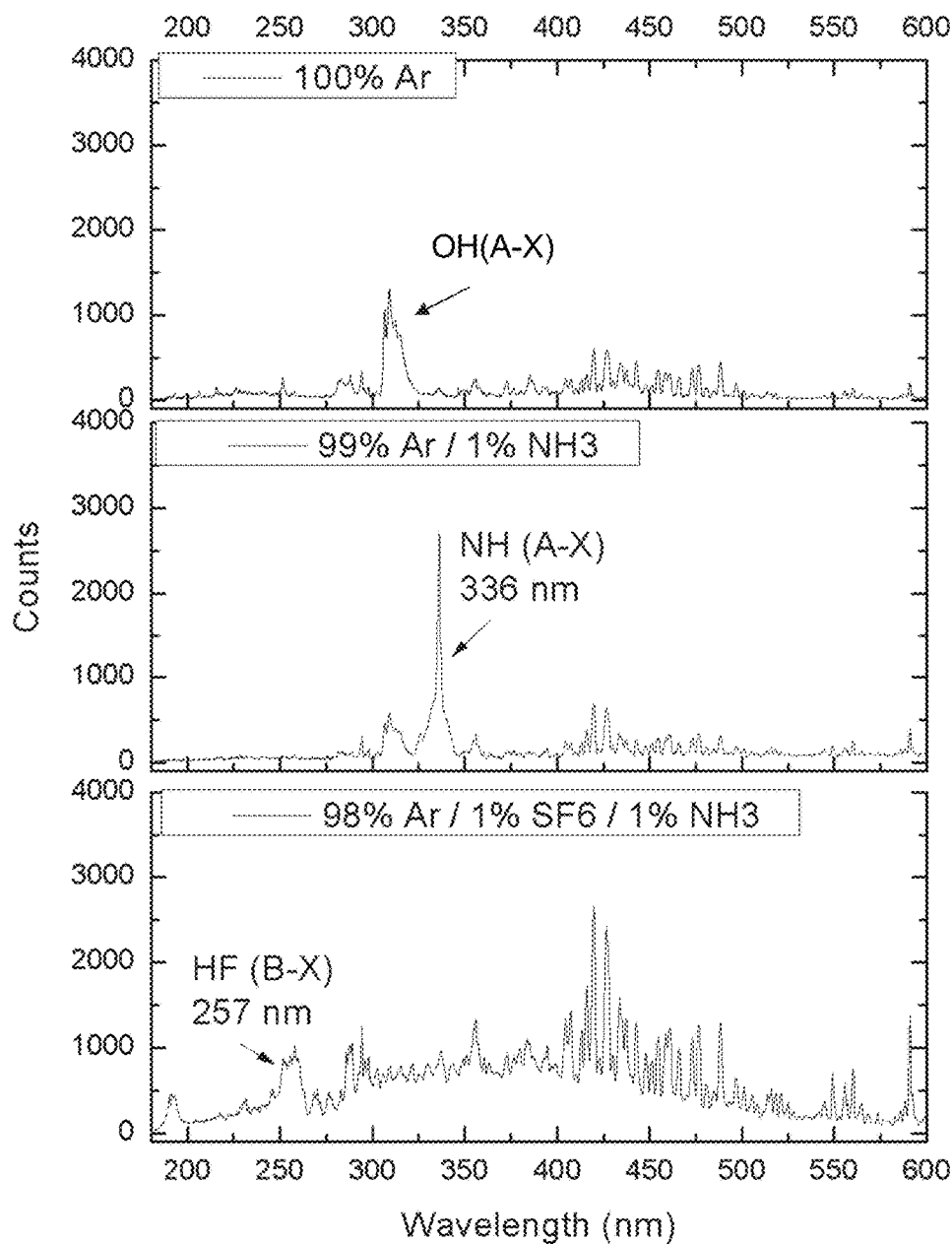
FIGS. 2A-2C are plots showing the UV emission spectrum for a gas flow comprising 100% Ar (FIG. 2A), 99% Ar and 1% $NH_3$ (FIG. 2B), and 98% Ar, 1% $SF_6$, and 1% $NH_3$ (FIG. 2C).
Figures 3A, 3B:
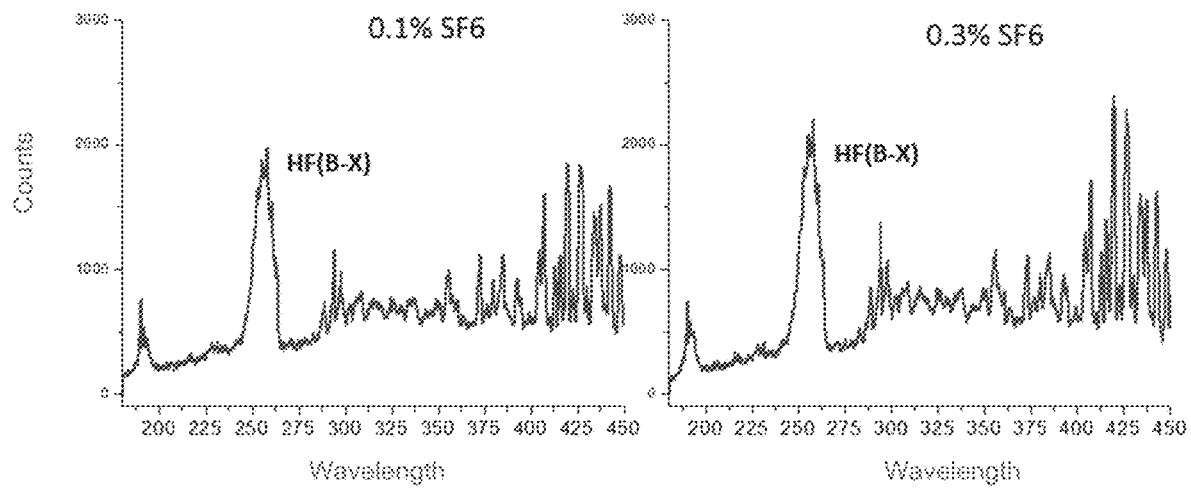
FIGS. 3A-3D are plots showing the UV emission spectrum for HF in an electron beam generated plasma for varying concentrations of $SF_6$ (0.1%, 0.3%, 2%, and 4%) in an ambient water vapor.
Figures 3C, 3D:
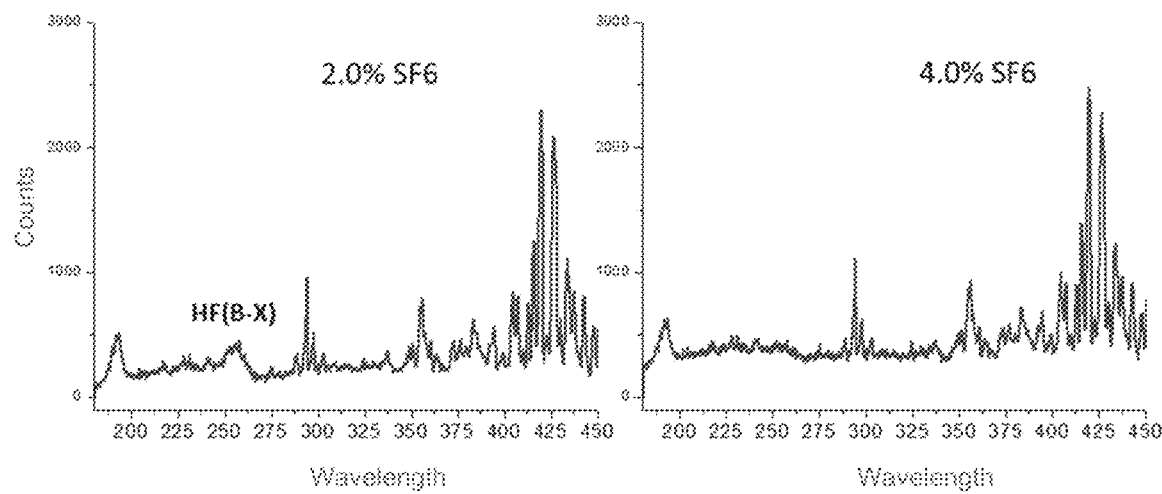

FIGS. 2A-2C illustrate how the addition of trace $SF_6$ concentrations eliminates the emission of the spectroscopic signature associated with ammonia (NH(A-X) emission) from the UV spectrum, indicating successful abstraction of hydrogen from the $NH_3$ molecules and creation of HF from a $Ar/SF_6/H_2O$ or $Ar/SF_6/NH_3$ gas flowing into the chamber in accordance with the present invention. As shown in FIG. 2A, the UV emission spectrum for a plasma produced by an electron beam passing through a 100% Ar flow (no $SF_6$) shows the spectroscopic signature associated with water at 308 nm (OH*(A-X) band) from water vapor impurities in the ambient. As shown in FIG. 2B, the UV emission spectrum for the electron beam-generated plasma produced by a gas flow comprising 99% Ar and 1% $NH_3$ shows the spectroscopic signature associated with ammonia (NH(A-X) emission, at 336 nm. In contrast, as shown in FIG. 2C, the UV emission spectrum for an electron beam-generated plasma produced by a gas flow comprising 98% Ar, 1% $SF_6$, and 1% $NH_3$ shows the spectroscopic signature of gas phase HF (HF (B-X)) emission at 257 nm). Note the elimination of the 336 nm NH(A-X) band and the appearance of the HF (B-X) emission. Although not shown in the FIGURES, the inventors have found that OH(A-X) emission at 308 nm is also quenched when trace concentrations of $SF_6$ are added in the presence of water vapor. This data experimentally demonstrates the mechanisms mentioned above where HF is formed through the removal of H from H-containing molecules such as $NH_3$.

Surprisingly, the production of HF is limited to low concentrations of reactive gases. The plots in FIGS. 3A-3D illustrate this phenomenon with respect to concentrations of $SF_6$. As can be seen from the FIGURES, when the concentration of $SF_6$ in the gas flow is at or below 2%, the HF(B-X) emission band is observable between 230-260 nm, whereas when the $SF_6$ concentration is 4% or higher, it is not. This is observed in both the $SF_6/H_2O$ case shown in FIGS. 3A-3D and in the $SF_6/NH_3$ case (not shown). In addition, as can be seen from FIGS. 3A-3D, the HF(B-X) emission is highest when the $SF_6$ flow fraction is at 0.3%, suggesting that a gas mixture having a low $SF_6$ flow fraction is optimal to produce HF gas using the method of the present invention.

Figures 4A, 4B, 4C:
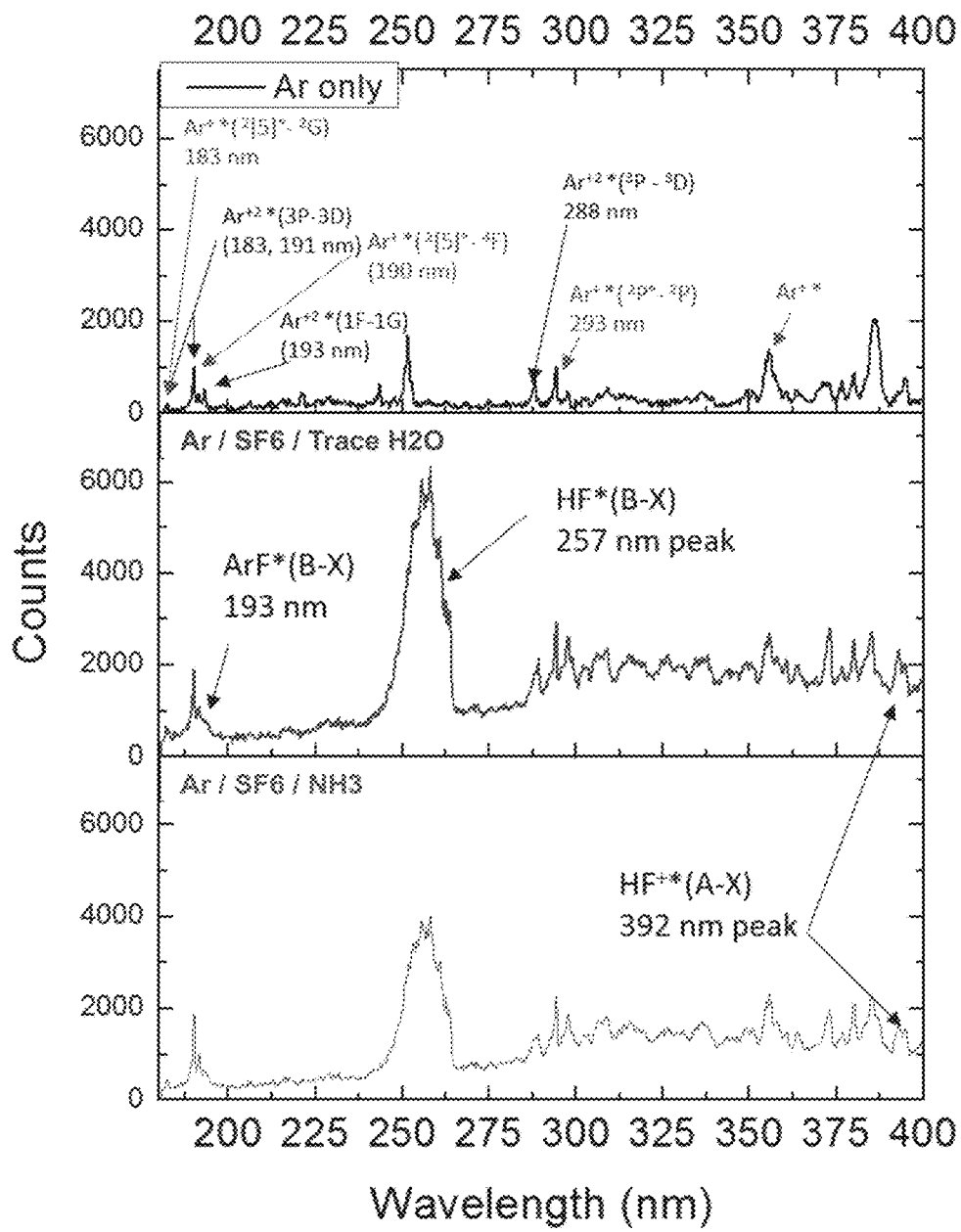
FIGS. 4A-4C are plots showing the UV emission spectrum for a gas flow comprising 100% Ar (FIG. 4A), 99.7% Ar and 0.3% $SF_6$ (FIG. 4B), and 98.7% Ar, 0.3% $SF_6$, and 1% $NH_3$ (FIG. 4C), with FIGS. 4A and 4B showing emission bands from HF produced in accordance with the present invention.

The plots in FIGS. 4A-4C depict the results of a more detailed characterization of an exemplary emission spectrum at low $SF_6$ concentration at lower wavelengths, for SF combined with ambient water vapor and with ammonia. The plots in FIG. 4A show the results for a 100% argon gas, i.e., no $SF_6$, and show multiple Ar ion lines in the plasma produced by the firing of the electron beam through the 100% Ar gas. FIG. 4B shows the emission spectrum for a plasma produced by a gas comprising 99.7% Ar and 0.3% $SF_6$ by flow with ambient water vapor as the hydrogen source, and shows the emission bands from the HF (B-X) transition and the ArF* excimer band. FIG. 4C shows the UV emission spectrum for a plasma produced from a gas flow comprising 98.7% Ar, 0.3% $SF_6$, and 1% $NH_3$, with the $NH_3$ providing the hydrogen. Both FIGS. 4B and 4C exhibit UV emission from the excited HF*molecules at about 240-260 nm, and UV emission from the excited $HF^{+*}$ molecular ion at about 380-400 nm. Again, as with the plots in FIGS. 3A-3D, the plots in FIGS. 4A-4C show that a low $SF_6$ flow fraction is optimal for the production of HF using the electron beam-based method and operating parameters of the present invention. This optimal $SF_6$ flow fraction typically will be in the range of 2% or less, but other flow fractions may also be considered to be sufficiently "low" under different operating pressures, and use of $SF_6$ or other F-containing gases at such "low" flow fractions is within the scope of the present disclosure.

These figures illustrate that both gas phase HF and HF+ ions are produced which can have utility in anisotropic etching processes.

Figure 5:
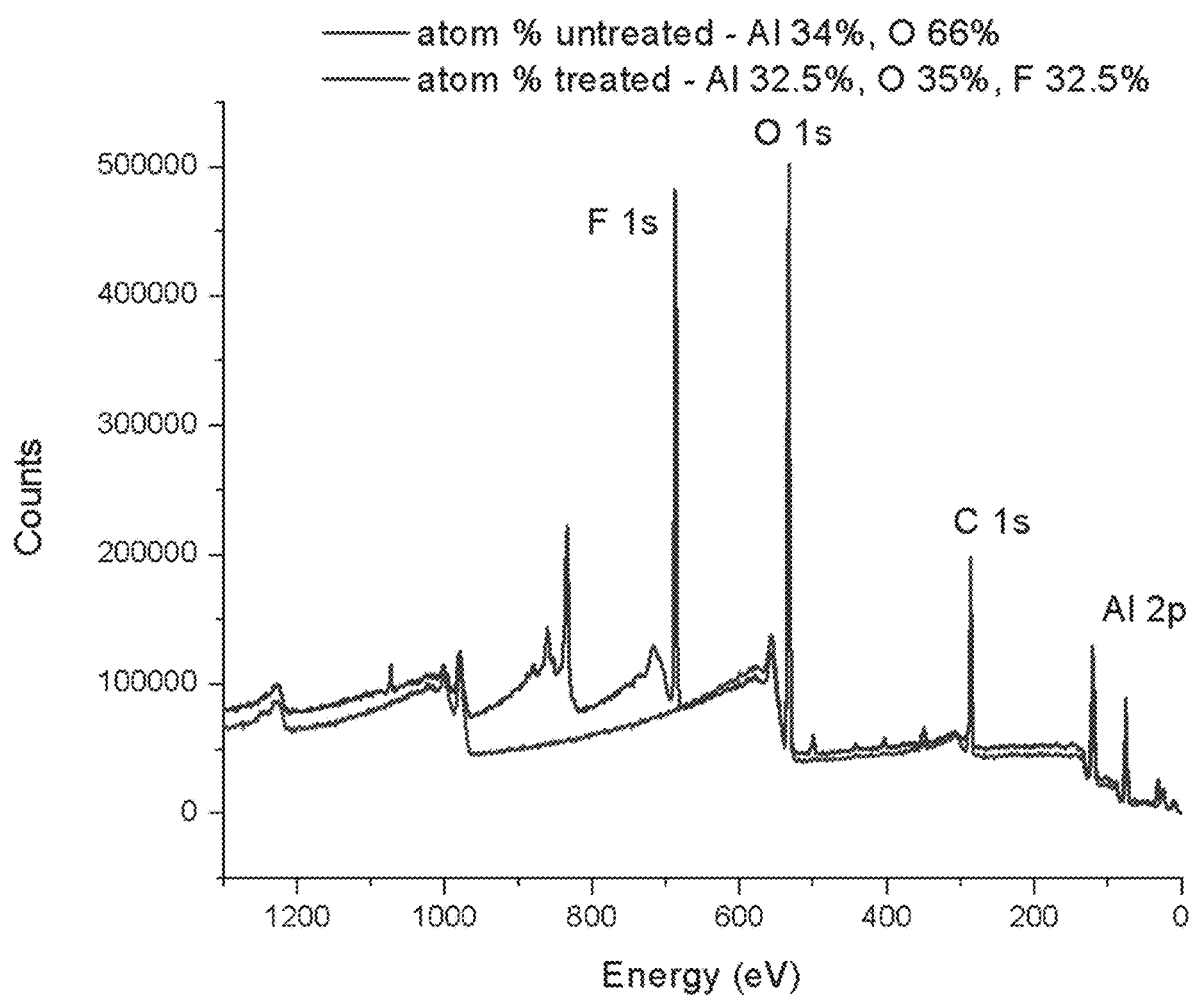
FIG. 5 is a plot showing an XPS survey spectrum and stoichiometry of an untreated Al thin film and an Al thin film treated with HF generated by an electron beam in a 98.7% Ar, 0.3% SF6, 1% $NH_3$ gas flow in accordance with the present invention.

The HF-containing plasma produced in accordance with the present invention was able to remove about half the oxygen from the native oxide layer of an aluminum thin film evaporated onto a glass substrate. This is illustrated by the plot in FIG. 5, which shows the result of X-ray photoelectron spectroscopy (XPS) analysis of as-received oxidized samples before and after exposure to an HF-containing plasma produced by passing an electron beam through a precursor gas at a pressure of 75 mTorr comprising 98.7% Ar, 0.3% $SF_6$, and 1% $NH_3$ by flow in accordance with the present invention. As can be seen from FIG. 5, following an exposure to the HF-containing plasma for 2 minutes, the concentration of oxygen on the sample was reduced from 66 atomic % to 35 atomic % and the fluorine concentration was ≈32 atomic %. Analysis of the Al 2p peak shows evidence of substantial Al-F bonding. As described below, further refinements to this process incorporating a preliminary gas dissociation chamber resulted in even more complete removal of the oxides on the sample.

Figure 6A:
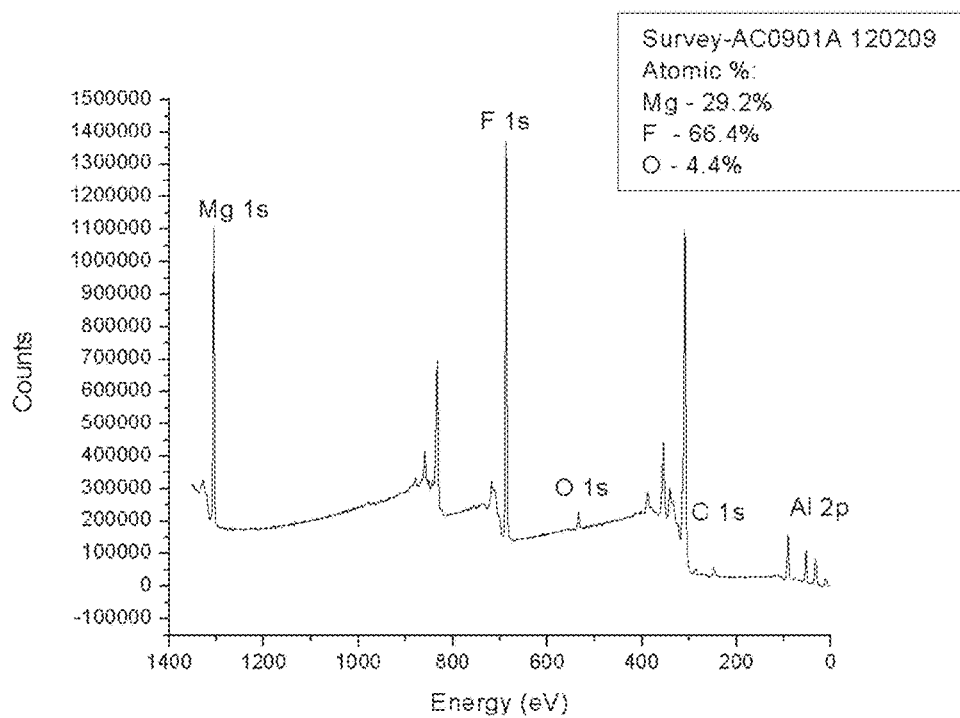
FIGS. 6A and 6B are plots showing an XPS survey spectrum and stoichiometry of an oxygen-contaminated $MgF_2$-coated Al thin film treated with HF produced in accordance with the present invention (FIG. 6A) and far UV reflectance data of a bare Al sample and of an $MgF_2$-coated Al thin film before and after treatment with HF produced in accordance with the present invention (FIG. 6B).
Figure 6B:
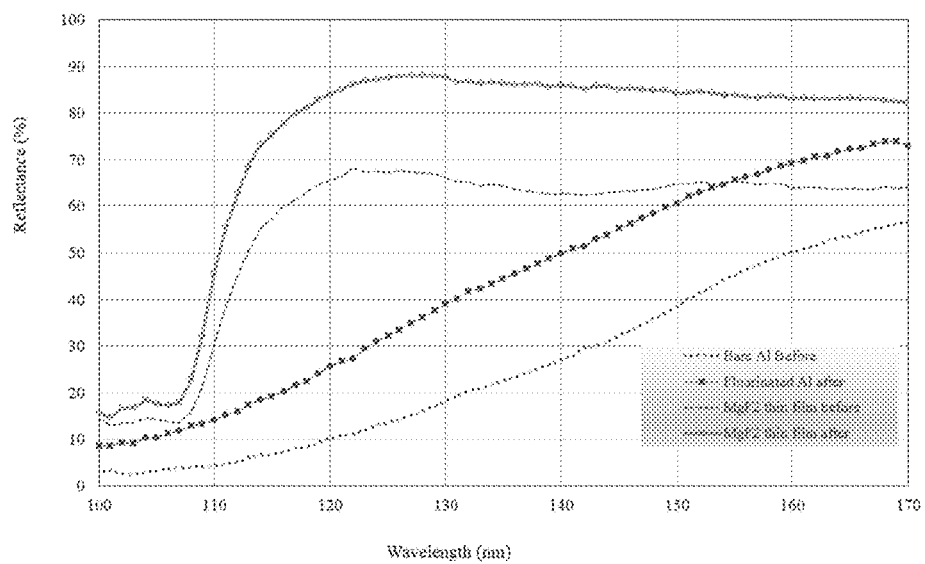

In some cases, such as the example illustrated in FIGS. 6A and 6B, the electron beam-generated plasma alone is sufficient to generate the HF density necessary to modify or clean surfaces. In the example shown in FIGS. 6A and 6B, a $MgF_2$ film had been stored in ambient atmosphere for many years, resulting in significant oxidation of its surface. The sample was treated with an electron beam-generated plasma which was generated at 75 mTorr from gas comprising 99.7% Ar and 0.3% $SF_6$, with ambient water vapor being the source of H for HF production. As can be seen from the XPS survey spectrum plot in FIG. 6A, following treatment, the oxygen was almost completely removed from the film. Importantly, the stored sample had exhibited a substantial loss of reflectivity and as illustrated by the UV reflectance plot shown in FIG. 6B, the plasma treatment was able to restore the sample to a reflectivity that exceeded its as-grown characteristics.

In other embodiments, control over HF production at a given gas composition and pressure can be provided through the use of an auxiliary discharge-based radical source on the gas flow into the processing chamber. Thus, in other embodiments of a method for generating HF from a gas flow in accordance with the present invention, the gas flow entering the treatment chamber is subjected to an initial introduction of electrical energy, typically up to 2000 W, to create an inductively coupled plasma (ICP) in the gas before it enters the main chamber. The plasma produced by this electrical energy can include an RF-driven capacitively coupled plasma, a DC discharge, a hollow cathode discharge, a microwave-driven discharge, or any other suitable plasma for dissociating gas. The applied electrical energy dissociates, or "pre-cracks" some of the fluorine atoms from the $SF_6$ (or other fluorine-containing precursor molecule) in the gas flow so that the gas flow that enters the chamber along with this preliminary ICP has an increased density of free fluorine atoms available to couple with the H atoms present in the hydrogen-containing precursor molecule (i.e. $NH_3$ or $H_2O$). The enhanced F atom production leads to enhanced HF production in the chamber.

Figure 7:
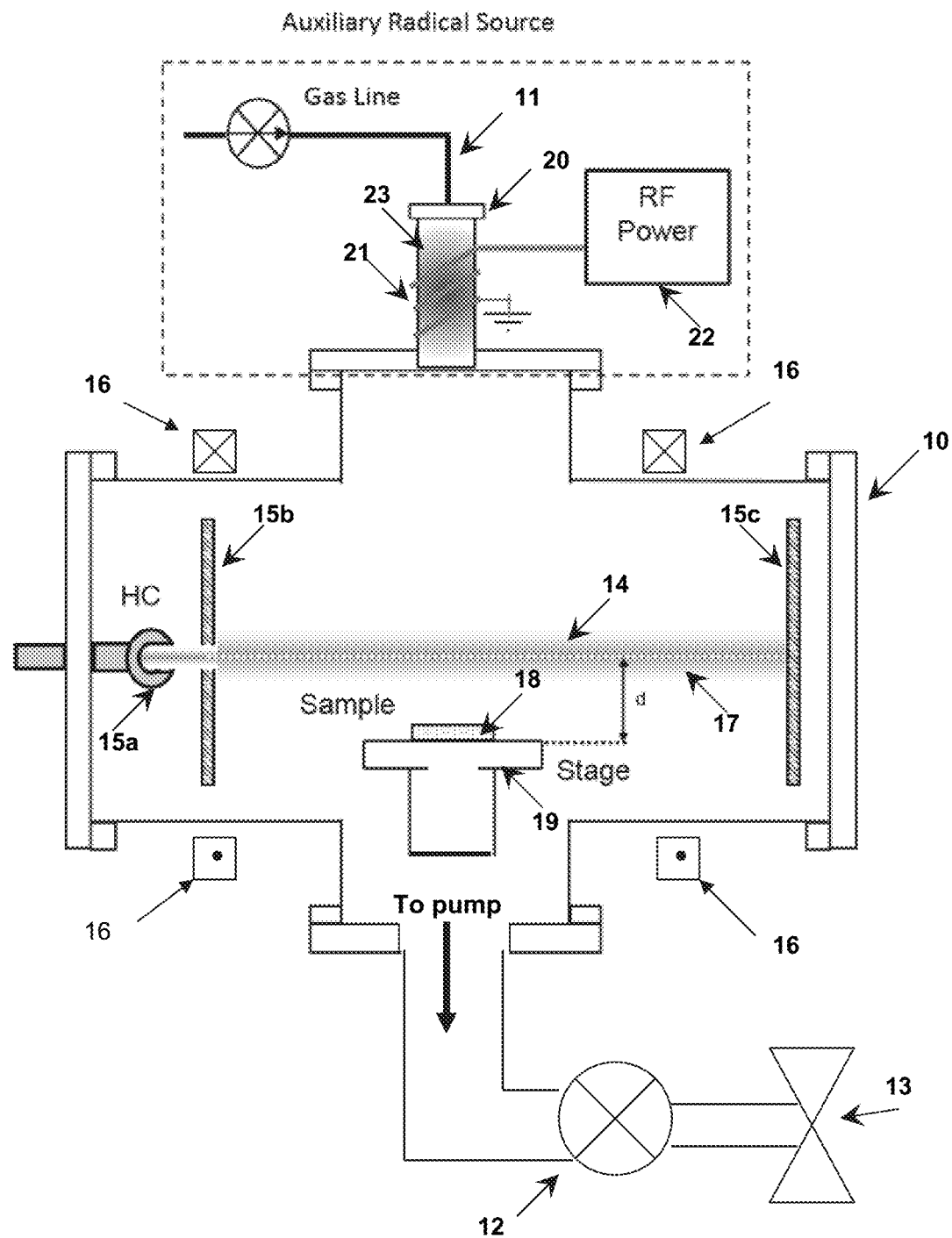
FIG. 7 is a block schematic illustrating aspects of an alternative exemplary apparatus in which an electron beam can be used to generate HF from a gas flow in accordance with the present invention.

FIG. 7 illustrates an exemplary apparatus that can be used to produce an electron beam-generated plasma to clean oxides off a sample in accordance with these alternative embodiments of the present invention.

The apparatus in accordance with this embodiment of the present invention includes the plasma treatment chamber 10 with all of the components described above with respect the embodiment illustrated in FIG. 1, but further includes a preliminary gas dissociation chamber 20 through which the gas flow passes before it enters the chamber. An RF coil 21 coupled to an RF power source 22 is wrapped around this preliminary chamber, and as described above, the RF power from the coil produces a preliminary plasma 23 in the gas flow in which fluorine atoms are "pre-cracked" from the $SF_6$. Electrical power to preliminary gas dissociation chamber 20 can be supplied continuously or in an ON/OFF manner to promote pulsing of the fluorine atoms into plasma treatment chamber 10.

The pre-cracked fluorine atoms from gas dissociation chamber 20 flow into plasma treatment chamber 10 along with the main gas flow, and in accordance with the present invention, both are illuminated by electron beam 14 to create an HF-containing plasma 17 in the chamber in a manner as described above, where the HF in the plasma removes oxidation from a sample 18 in the chamber. The HF-containing gas is then directed into a scrubber 12 where the HF is captured or neutralized via methods known in the art before being exhausted though an output valve 13.

Figure 8:
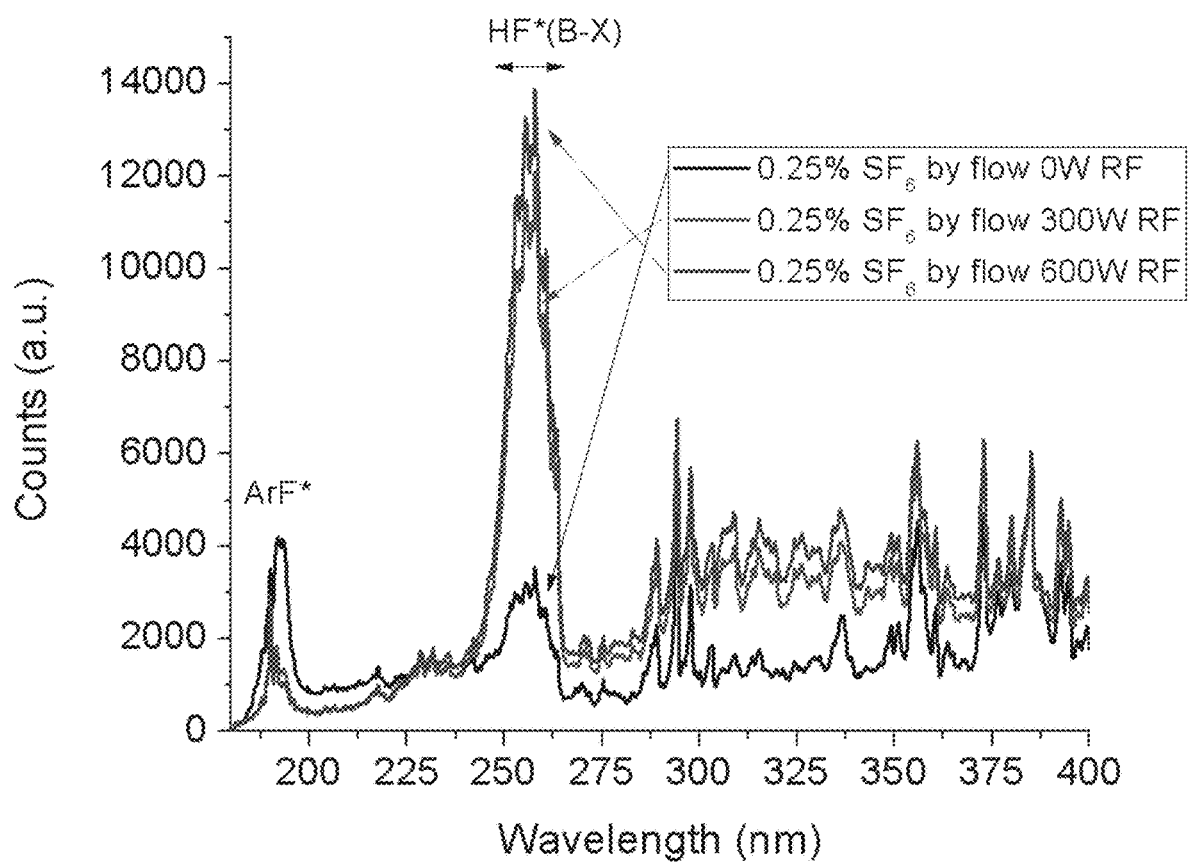
FIG. 8 is a plot illustrating the manner in which the emission from HF increases with application of an auxiliary inductively coupled plasma radical source to pre-dissociate $SF_6$ in the gas flow.

The plot in FIG. 8 illustrates the way in which controlled application of RF power to the feed gas can controllably increase the density of HF relative to the case when only electron beam-generated plasma is used in accordance with the present invention. Overall this implies that the density of HF can be further controlled when electrical power is applied to the feed gas in a preliminary gas dissociation chamber as in the embodiment discussed above with respect to FIG. 7.

FIG. 8 illustrates three cases, one in which no RF power is applied to a feed gas that includes 0.25% $SF_6$ by flow, one in which 300 W RF power is applied to the feed gas, and one in which 600 W RF power is applied. As can be seen from the plot in FIG. 8, the lowest concentration of HF was observed for a plasma produced without any application of RF power to the feed gas. Significantly higher HF concentrations were observed for both cases in which RF power was applied to the feed gas, with the highest concentration—nearly a five-fold increase—of HF being observed in the case where 600 W of RF power was applied. This clearly illustrates that using an auxiliary electrical discharge to dissociate the feed gas prior to its entering the plasma treatment chamber leads to enhanced HF production in the plasma that can be used to treat an oxidized sample in the chamber, and shows that the HF production from benign precursors in accordance with the present invention can further be controlled by controllably applying electrical power to the gas to create the plasma. It should be noted that while the examples here describe applying 300 W and 600 W RF power to the input gas, other appropriate RF power levels can be applied in accordance with this aspect of the present invention.

Modulation of the $SF_6$ concentration in the feed gas controls the number of fluorine atoms produced in the "pre-cracked" auxiliary discharge, whereas modulation of the beam current controls the number of ions produced in the electron beam generated plasma used to treat an oxidized sample. The plots in FIGS. 9A-9D illustrate the ability to increase the F atom to positive ion ratio by 2 orders of magnitude, from a ratio of about 2 to over 300, and show that the ratio of F atom to positive ion ratio can be controlled over 3 orders of magnitude by using the auxiliary discharge source to control F atom production and by either modulating the $SF_6$ concentration at constant electron beam current or modulating the electron beam current at constant $SF_6$ concentration. Importantly, with the RF auxiliary source, operating higher relative flows (6%) of $SF_6$ were used compared to the $SF_6$ flows of <4% in the electron beam-only case described above, and yet strong HF emission is visible even at high concentrations of $SF_6$. Thus, in accordance with this embodiment of the present invention, the addition of the preliminary gas dissociation chamber allows the achievement of HF production with higher $SF_6$ flows than can be realized in the electron beam-only process illustrated in FIG. 3. It should be noted that the described $SF_6$ concentration of 6% is only exemplary and there is no limit to the concentration of H- and F-containing gases that can be present in the gas flow in this embodiment of the present invention.

Figure 9A:
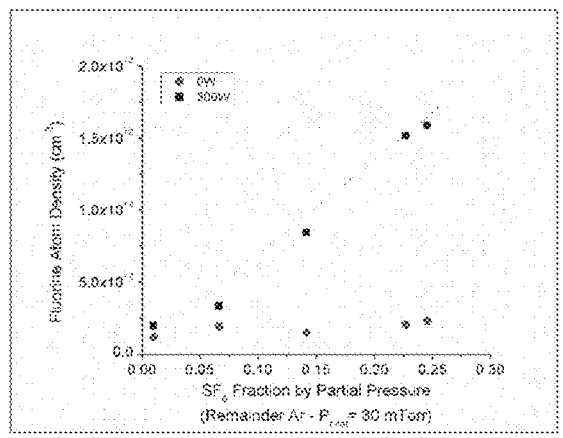
FIGS. 9A-9D are plots illustrating fluorine (F) atom density as a function of $SF_6$ concentration with and without 300 W of RF power into the auxiliary discharge (FIG. 9A); F atom to positive ion ratio as function of partial pressure of $SF_6$ under RF power applied to the gas flow as it enters the chamber (FIG. 9B); increasing positive ion density and constant F atom density with increasing electron beam current at a constant $SF_6$ flow fraction and RF power (FIG. 9C); and F atom to positive ion ratio as function of electron beam current at a constant $SF_6$ flow fraction under RF power applied to the gas flow as it enters the chamber (FIG. 9D).

Thus, FIG. 9A shows F atom density as a function of $SF_6$ concentration with and without 300 W of RF power into the feed gas to form the auxiliary plasma discharge, with the ion density being held constant by maintaining 20 mA of electron beam current, and shows that F atom density can be controlled independent of the ion density.

Figure 9B:
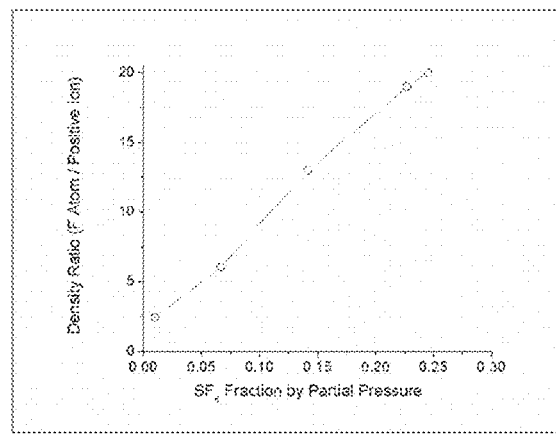
Figure 9C:
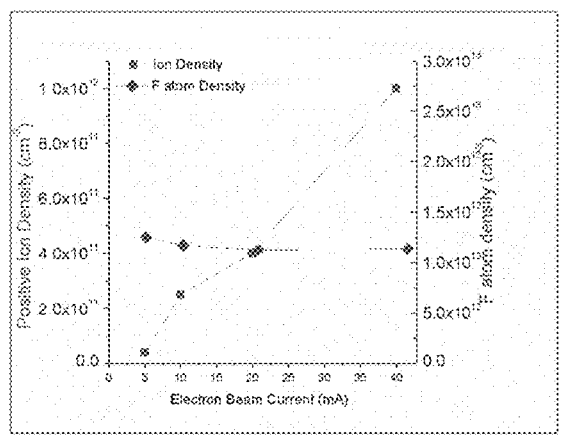
Figure 9D:
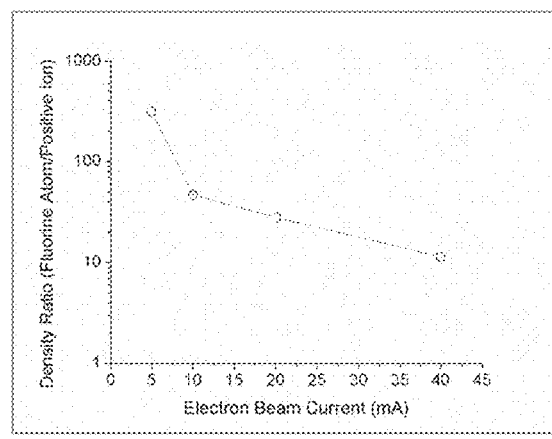

FIGS. 9B-9D further illustrate ways in which F atom density in the electron beam-generated plasma can be controlled in accordance with the present invention.

As seen from the plot in FIG. 9B, which shows the ratio of F atoms to positive ions at a constant 300 W of RF power, the density of F atoms in a plasma produced from a pre-cracked feed gas increases as the fraction of $SF_6$ by partial pressure in the initial feed gas increases. In other cases, as shown in FIG. 9C, increasing the electron beam current from 5 mA to 40 mA while maintaining a constant $SF_6$ concentration (by partial pressure) and RF power (300 W), can increase the positive ion density in the plasma. As shown in FIG. 9D, this leads to a decreasing density ratio of F atoms to positive ions in the plasma.

As noted above, it is known that production of electron beam-generated plasmas can be readily modulated by pulsing the electron beam. See C. D. Cothran et. al., "Continuous and pulsed electron beam production from an uninterrupted plasma cathode," *Surface and Coatings Technology* 267, 111-116 (2015); see also D. R. Boris et. al., "On the Mechanism of Pulsed Electron Beam Production From an Uninterrupted Plasma Cathode," *IEEE Transactions on Plasma Science* 44 (5), 761-768 (2016). Combining these beam pulsing methods with the use of an auxiliary discharge-based radical source in accordance with the present invention offers the ability to tune the ratio of F atoms to ions over an even larger range than shown above. Combined, the system can be used to tune this ratio by several orders of magnitude, ranging from ion-rich plasmas that allow for highly anisotropic surface modifications, to nearly ion-free environments dominated by gas chemistry that are well-suited for isotropic surface processes.

Advantages and New Features

The plasma-based process for generating HF in accordance with the present invention has a number of important advantages and new features:

The process requires common and benign precursors such as Ar, $SF_6$, and $H_2O$ or $NH_3$. As a result, the process in accordance with the present invention does not require extensive safety equipment and protocols are not required and poses no significant hazard to equipment or personnel.

In addition, the process of the present invention generates HF in very small quantities, nearly eliminating hazardous waste concerns.

The low reactive gas load needed to produce HF minimizes the delivery of secondary products to the surface and makes it well-suited as a pretreatment step for follow on processes.

The process of the present invention allows for in-situ thin film treatments that do not require the breaking of vacuum or that that the films to be treated be exposed to ambient conditions, and thus substantially reduce concerns of film contamination during manufacturing.

The process is a plasma-based process easily adapted to existing industrial plasma processing infrastructure. Electron beam-driven plasmas possess a uniquely low electron temperature, and as a result, ion energies at surfaces are significantly lower than those found in commonly employed plasma processing tools. Consequently, the process has an inherently wide process space and can be employed to remove oxides from a broad range of materials classes, ranging from polymers to metals.

Finally, with the addition of an auxiliary discharge to "pre-crack" the feed gas, both HF and F atom production can be controlled with great precision. This allows greater flexibility in both the production of HF and F in the plasma, with the ratio of ions to radicals (both HF and F) being controllable up to 3 orders of magnitude.

Methods and apparatuses for the production of HF from an electron beam-generated plasma have been described. Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A method for removing oxides from a surface of a sample, comprising:
    placing a sample having an oxidized surface in a chamber;
    directing a gas flow consisting of $Ar/SF_6/H_2O$ gas into the chamber;
    directing an electron beam into the $Ar/SF_6/H_2O$ gas in the chamber, the electron beam generating a plasma extending radially from an axis of the electron beam in the chamber, the sample being situated in the chamber so that it is immersed in the plasma but is not impacted by the electron beam;
    wherein the electron beam is configured to have sufficient energy to cause F atoms to dissociate from F-containing molecules in the $Ar/SF_6/H_2O$ gas, the F atoms then reacting with H-containing molecules in the $Ar/SF_6/H_2O$ gas to form HF molecules in the plasma; and
    wherein at least one of an energy of the electron beam, a concentration of the $SF_6$ and the $H_2O$ in the $Ar/SF_6/H_2O$ gas, a current of the electron beam, and a duration of the electron beam is configured to produce a predetermined concentration of HF and positive H+ ions in the plasma, and
    wherein the HF molecules and the positive H+ ions remove the oxides from the oxidized surface of the sample.

2. The method according to claim 1, wherein the gas flow produces a pressure in the chamber of 1 Torr or less.

3. The method according to claim 1, wherein the electron beam has an energy of at least 50 eV.

4. The method according to claim 1, wherein the electron beam is a pulsed electron beam; and further wherein at least one of an energy of the electron beam, a current of the electron beam, and a frequency of the electron beam pulses is configured to produce a predetermined concentration of HF molecules in the plasma.

5. The method according to claim 1, wherein the electron beam is a pulsed electron beam; and further wherein at least one of an energy of the electron beam, a current of the electron beam, and a frequency of the electron beam pulses is configured to produce a predetermined concentration of positive ions in the plasma.

* * * * *